(12) United States Patent
Camerlenghi et al.

(10) Patent No.: US 8,211,762 B1
(45) Date of Patent: Jul. 3, 2012

(54) NON-VOLATILE MEMORY

(75) Inventors: Emilio Camerlenghi, Bergamo (IT); Giulio Albini, Milan (IT)

(73) Assignee: Micron Technology, Inc., Boise, ID (US)

(*) Notice: Subject to any disclaimer, the term of this patent is extended or adjusted under 35 U.S.C. 154(b) by 208 days.

(21) Appl. No.: 12/512,907

(22) Filed: Jul. 30, 2009

(51) Int. Cl.
- *H01L 21/8238* (2006.01)
- *H01L 21/336* (2006.01)
- *H01L 21/4763* (2006.01)

(52) U.S. Cl. ........ 438/201; 438/211; 438/257; 438/593; 257/E21.422

(58) Field of Classification Search .......... 438/201, 438/211, 257, 593; 257/E21.422
See application file for complete search history.

(56) References Cited

U.S. PATENT DOCUMENTS

| | | | |
|---|---|---|---|
| 6,900,096 B2 | 5/2005 | Dong et al. | |
| 6,908,814 B2 | 6/2005 | Jeng et al. | |
| 7,390,714 B2* | 6/2008 | Jeong et al. | 438/257 |
| 7,563,689 B2 | 7/2009 | Hong | |
| 7,573,089 B2 | 8/2009 | Kim et al. | |
| 2006/0108648 A1* | 5/2006 | Yuan | 257/396 |
| 2009/0023279 A1 | 1/2009 | Kim et al. | |

OTHER PUBLICATIONS

Gutmann, "Data Remanence in Semiconductor Devices", Usenix, Security 2001 Paper, Security '01 Tech Program Index, pp. 39-54 of the *Proceedings*, (2001), downloaded from internet at http://www.usenix.org/events/sec01/full_papers/gutmann/gutmann_html/index.html, Aug. 26, 2009.

Pei, "Electrical Characterization of Metal—Oxide—Semiconductor Memory Devices with High-Density Self-Assembled Tungsten Nanodots", *Japanese Journal of Applied Physics*, vol. 47, No. 4, pp. 2680-2683 (2008), downloaded from internet at http://jjap.ipap.jp/link?JJAP/47/2680/, Aug. 26, 2009.

Song, "Highly Manufacturable 90 nm NOR Flash Multi-Level Cell Technology with WSix Gate", *Japanese Journal of Applied Physics*, vol. 46, No. 6, pp. L120-L122 (2007), downloaded from internet at http://adsabs.harvard.edu/abs/2007JaJAP..46L.120S, Aug. 26, 2009.

Wu, "A Scalable Split-Gate Flash Memory Cell Structure and Its Contatless Flass Memory Arrays", *Journal of Science and Engineering Technology*, vol. 1, No. 1, pp. 5-16 (2005), downloaded from internet at http://www.dyu.edu.tw/~journal/setjournal/document/setcv01n102.pdf, Aug. 26, 2009.

* cited by examiner

*Primary Examiner* — Ngan Ngo
(74) *Attorney, Agent, or Firm* — Berkeley Law & Technology Group, LLP

(57) ABSTRACT

Briefly, embodiments of non-volatile memory and embodiments of fabrication thereof are disclosed. For example, a non-volatile memory device having a gate assembly with a floating gate and a control gate assembly is described. The control gate assembly includes a non-metal conductive control gate and a metal control gate in one embodiment. Additional embodiments are described, including use of a sacrificial nitride layer and forming contact recesses to create source or drain contacts, as other examples.

10 Claims, 4 Drawing Sheets

NON-VOLATILE MEMORY

BACKGROUND

1. Field

Aspects of this disclosure relate to memory, and particularly, to methods of fabrication thereof.

2. Information

Flash memory devices may be characterized as a type of non-volatile memory. Improvements in non-volatile memory devices, such as flash memory, may involve, for example, operating more quickly, providing more reliability, or having a greater memory location density. It is desirable to continue to improve various aspects of non-volatile memory performance.

BRIEF DESCRIPTION OF DRAWINGS

Aspects or advantages of this disclosure will become apparent from a review of the following detailed description. Such aspects or advantages may be illustrated by way of example if considered in conjunction with the following accompanying drawings.

DETAILED DESCRIPTION

Figure 1:
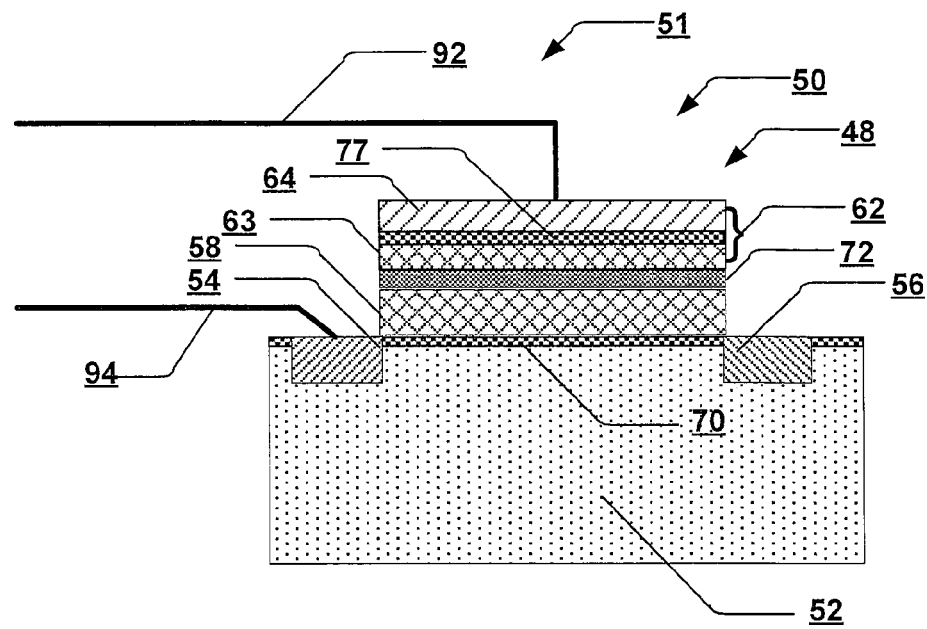
FIG. 1 is a schematic diagram showing an embodiment of a structure of memory, such as a memory cell or memory location.

Aspects of this disclosure may relate to memory devices, as well as memory device fabrication techniques. Certain memory devices may comprise, for example, one or more non-volatile memory devices 51, such as flash memory devices in this particular example embodiment, as described below with respect to FIG. 1. Certain non-volatile memory devices 51 may comprise one or more memory cells 50, again, in this example embodiment, flash memory cells. Certain embodiments of memory device 51 comprise one or more memory cells 50 that may include associating control circuitry (not shown) to allow the memory cells to operate. Certain fabrication techniques may be used to fabricate the one or more memory cells, such as one or more cells 50. Memory structure 48, as shown in FIG. 1, is intended to comprise a substrate 52, as well as the one or more memory cells attached thereto, which here comprises physical materials, such as layers used to form non-volatile memory cells, here, in this example, flash memory cells.

Certain embodiments of fabrication techniques may be described with respect to FIGS. 2 to 8. Fabrication, in this particular context, may involve a variety of processes employed to manufacture a device comprising, without limitation: depositing, etching, metalizing, layering, chemical mechanical polishing, or any combination thereof, as well as other types of processes.

In the course of the following description, similar reference numerals may be employed in situations where a structural element and a process element may be associated. For instance, a particular element, such as a floating gate, may be provided a particular reference numeral, such as 58, for example. Likewise, a floating gate layer that may be processed during fabrication of memory may, at the completion of such fabrication, comprise floating gate 58 and, likewise, for convenience, be referred to as floating gate layer 58, if being described before fabrication is complete, without any loss of generality. This reference numeral association between fabricated elements, and layers used to fabricate those fabricated elements may provide clarity as well as offer convenience.

Figure 2:
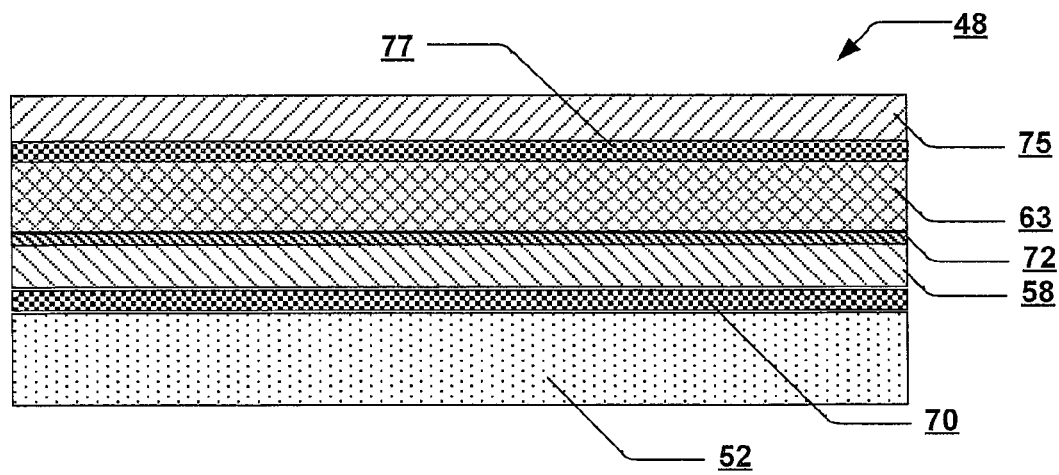
FIG. 2 is a schematic diagram showing a partial cross sectional view of the embodiment of memory shown in FIG. 1 undergoing fabrication.

A variety of fabrication techniques may be used to fabricate a variety of flash memory cells 50 of FIG. 1, for example, using fabrication techniques as now described with respect to FIGS. 2 to 8. FIG. 2 illustrates substrate 52, on which a series of layers that undergo processing are indicated as being deposited, etched, or otherwise processed. Substrate 52 may at least partially comprise silicon, gallium arsenide, silicon on insulator, or other substrate forms or technologies. In certain instances, a tunnel layer 70 may be deposited over, as well as formed on or in, substrate 52. Tunnel layer 70 may comprise a dielectric that may, for example, be formed on or over at least part of substrate 52. Tunnel layer 70 may in connection with device operation allow charge to transfer to or from floating gate 58. Embodiments may, for example, include an electrode to store electrons. In an embodiment, as an illustrative example without limitation, stored content of memory cells, for example, may depend at least in part on the presence or absence of electrons, such as whether a digital '0' or a digital '1' is stored and detectable, for example. Tunnel layer 70 may, for example, comprise silicon oxide. One technique to realize tunnel layer 70 may involve oxidizing substrate 52 to potentially provide a resulting dielectric.

During one aspect of fabrication, as illustrated in FIG. 2, floating gate layer 58 may be deposited over at least a portion of tunnel layer 70. An interpoly dielectric layer 72 may be deposited over at least a portion of floating gate layer 58. Interpoly dielectric layer 72, being a dielectric, may limit electrical conduction between floating gate 58 and certain other portions of a poly/metal control gate assembly to be fabricated, such as 62, of FIG. 1, as explained in more detail below.

During fabrication, as illustrated in FIG. 2, a non-metal conductive control gate layer 63 may be deposited over at least a portion of interpoly dielectric layer 72. Non-metal conductive control gate layer 63 may comprise a non-metal electrically conductive material, such as polysilicon, also known as "poly," which at times may be used as a conductive not-metallic layer in semiconductor processes.

With reference to FIG. 2, an optional oxide interlayer 77 may be formed over at least a portion of non-metal conductive control gate layer 63. A sacrificial nitride layer 75 may be deposited over at least a portion of non-metal conductive control gate layer 63. Depending at least in part upon the particular embodiment, non-metal conductive control gate layer 63 may or may not be covered or coated, during fabrication, by optional oxide interlayer 77. As previously alluded to, FIG. 2 illustrates certain layers during fabrication, rather than a formed memory device (as illustrated in FIG. 1), for example.

In this particular context, claimed subject matter relating to depositing layers or the like is not necessarily limited to having been deposited immediately upon or immediately adjacent one another. For example, with reference to FIG. 2, non-metal conductive control gate layer 63 may be deposited over interpoly dielectric layer 72. In certain embodiments intended to be within the scope of claimed subject matter, one or more additional layers of material may be situated between layers of a particularly described embodiment. Sacrificial nitride layer 75 of FIG. 2, for example, may be deposited over optional oxide interlayer 77 or non-metal conductive control gate layer 63. As such, sacrificial nitride layer 75 may also be considered as being deposited above or over at least a portion of interpoly dielectric layer 72.

Fabrication configurations or techniques, as described in some embodiments herein, may vary from those of a variety of conventional or known configurations or approaches. For instance, to fabricate a conventional non-volatile memory cell realizing a vertical stack configuration, it may be desired to deposit over substrate 52, similar to FIG. 2, a tunnel layer 70, a floating gate layer 58, a non-metal conductive control gate layer 63 (for example, comprising polysilicon), and a metal-based material (for example, comprising $WSi_2$) resulting in a structure similar to FIG. 1. Control gate structures of conventional flash memory devices may therefore be made, at least partially, of a material compatible with a reoxidation process. A control gate 64, for example, may be formed from a metallic layer if it is compatible with reoxidation. WSi2 is typically used. Other metal materials not compatible with reoxidation, examples of which may include Tungsten or Cobalt, are not generally used as a result.

Figure 3:
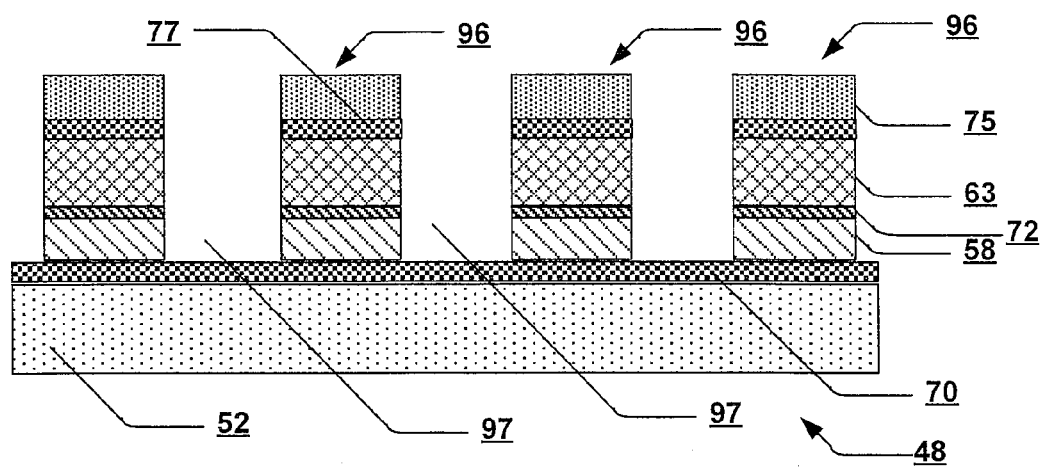
FIG. 3 is a schematic diagram showing a partial cross sectional view of the embodiment of memory shown in FIG. 1 undergoing more fabrication.

Gate reoxidation, for example, in one embodiment, may be performed after a gate etch operation, as described with respect to FIG. 3, so gate reoxidation may at least partially or more completely encapsulate an overall stack with a thin oxide layer. Of course, a previously performed etch operation may affect tunnel 70 and interpoly dielectric layer 72. Following fabrication of vertical stacks 96 via a gate etch, as described with respect to FIG. 3, some oxidizing treatment (reoxidation) may be applied to recover or reproduce etch damage of tunnel and interpoly dielectric layers. Reoxidation may be performed following gate etch of FIG. 3 to form boundary voids 97, and before boundary voids 97 are filled with dielectric to form inter cell material 74 of FIGS. 4 and 7. Therefore, in comparison with a conventional approach, like those described above, for example, metal gates, such as Tungsten or Cobalt, compatible with a previous stack reoxidation, may be employed. Other advantages of such an embodiment are also possible, such as improved manufacturability, process control, or cleanings, for example.

Reducing resistivity of metal control gate 64 may be desirable for some embodiments. For example, pure Tungsten or Cobalt may be substituted for $WSi_2$, which is used at times in a number of conventional systems that expose a metal control gate to oxygen. However, exposing metal of a conventional metal control gate with oxygen may affect application of a reoxidation process. Instead, for example, here a lower resistance may result in an embodiment, for example, if Tungsten is used, while also potentially maintaining a possibility to improve dielectric quality by applying a reoxidation process.

In one embodiment, a damascene gate process, described in more detail below, may be employed to introduce metal control gate layers after performing a gate etch that are thereby interlaced in the resulting structure with a subsequent reoxidation. A damascene gate process embodiment may address issues related to metal gate cleaning. A damascene gate may, for example, improve resist removals and cleanings while reducing risk of etching the wall of a metal gate layer.

An embodiment of a damascene process for fabricating a metallic control gate may also be applied to different non-volatile memories other than flash memory devices 51. Examples of non-volatile memories include those substituting a floating gate with layers to store electrons. Examples include "charge trap" memories in which a floating gate may, for example, be substituted with a nitride or other charge trap layer.

Additionally, an interpoly dielectric may be substituted with a "top dielectric" such as silicon oxide, aluminum oxide, or other proper dielectric.

FIG. 3 illustrates a side, partial cross sectional view of subsequent fabrication to FIG. 2. Portions of layers may be etched, thereby in certain embodiments leaving layered, separate, vertical stacks 96 attached to, and extending from, substrate 52. Adjacent separate, vertical stacks 96, as shown for this embodiment, are separated by boundary voids 97. Stacks 96 may, following subsequent processing, substantially delineate a shape of a flash memory cell, such as, for example, 50 of FIG. 1, of a formed memory device. Material etched away to form boundary voids 97 may, for example, extend through layers, such as those illustrated in FIG. 2, comprising, but not limited to, sacrificial nitride layer 75, optional oxide interlayer 77, non-metal conductive control gate layer 63, interpoly dielectric layer 72, as well as floating gate layer 58. Outlines or edges of stacks 96 of FIG. 3 may correspond to outlines or edges of the formed flash memory cells 50, if multiple flash memory cells 50 were shown in FIG. 1.

Layers of stacks 96 may comprise, but are not limited to: sacrificial nitride layer 75, optional oxide interlayer 77, non-metal conductive control gate layer 63, interpoly dielectric layer 72, and floating gate layer 58. However, sacrificial nitride layer 75 of stack 96, illustrated in FIG. 3, may not be included in a formed memory device, as explained below.

Stacks 96 may, for example, be at least partially controllably or selectively etched in a variety of patterns or cross-sectional shapes using, for example, photolithographic or other conventional patterning techniques, as well as patterning techniques to be developed. Here, with etching, for example, a horizontal cross section may be made substantially uniform layer-to-layer. Therefore, after photolithographic etching, stacks 96 may include substantially consistently shaped or sized horizontal cross sections in various substantially parallel vertical planes through the stacks. In this particular context, this feature of the layers of stacks 96 is referred to "alignment" as used with respect to the elements or layers of stacks 96. Therefore, for this particular embodiment, as illustrated by FIG. 3, for example, one or more of layers of stacks 96, which may include sacrificial nitride layer 75, optional oxide interlayer 77, non-metal conductive control gate layer 63, interpoly dielectric layer 72, and floating gate layer 58 may be substantially aligned. Substantially aligned layers may be desirable for a memory device. For example, if electrical flow is taking place layer-to-layer during device operation, substantial alignment may enhance electrical flow since there may be fewer areas of discontinuity in electrical flow in comparison with other configurations or arrangements of layers. Here, it is also noted that etched sides of a vertical stack 96 may at least partially define a boundary void 97 of FIG. 3.

Figure 4:
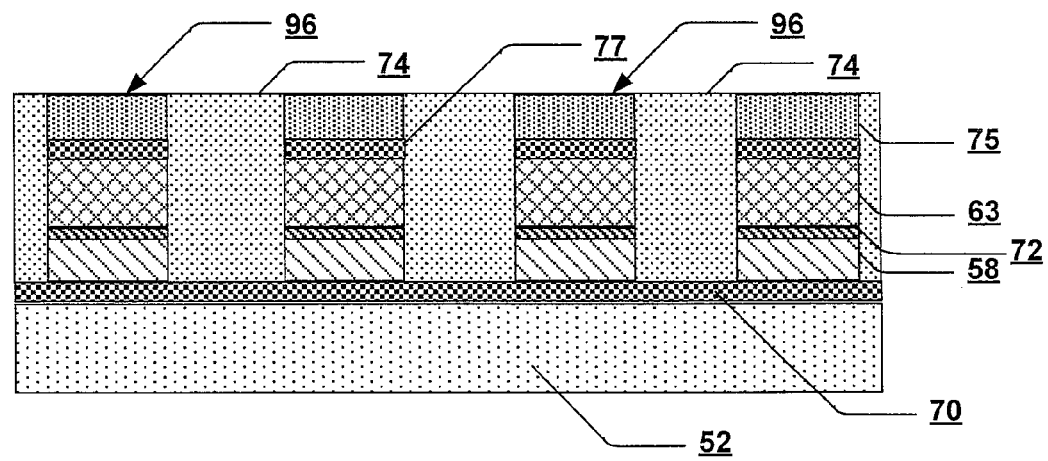
FIG. 4 is a schematic diagram showing a partial cross sectional view of the embodiment of memory shown in FIG. 1 undergoing still more fabrication.

FIG. 4 illustrates certain aspects of filling boundary voids 97 of FIG. 3. For instance, inter cell material 74 may be deposited to fill boundary voids 97 of FIG. 3. Inter cell material 74 may, for example, but not necessarily, comprise a dielectric to limit electrical conduction between separate stacks 96.

During deposition, inter cell material 74 may overflow boundary voids 97 and may at least partially coat or cover exposed surfaces of sacrificial nitride layer 75, which may make subsequent etching of sacrificial nitride layer 75 more difficult. As such, at least some inter cell material 74 may be planarized or otherwise etched, if desired. Chemical-mechanical polishing represents one such etching or planarization technique, though others are readily available and are intended to fall within the scope of claimed subject matter.

Sacrificial nitride layer 75 may be used to aid in shaping a metal control gate 64 to be fabricated. Metal control gate 64 may be fabricated, using processing techniques as described below with respect to FIGS. 5 to 8, in the shape or dimension of sacrificial nitride layer 75 of FIG. 4. As such, sacrificial nitride layer 75 may be substantially aligned such as in the manner previously described, for example. Sacrificial nitride layer 75 may be used as a pattern for metal control gate 64 with a desired shape or dimension. Therefore, metal control gate 64 may be substantially aligned in a formed memory device.

Figure 5:
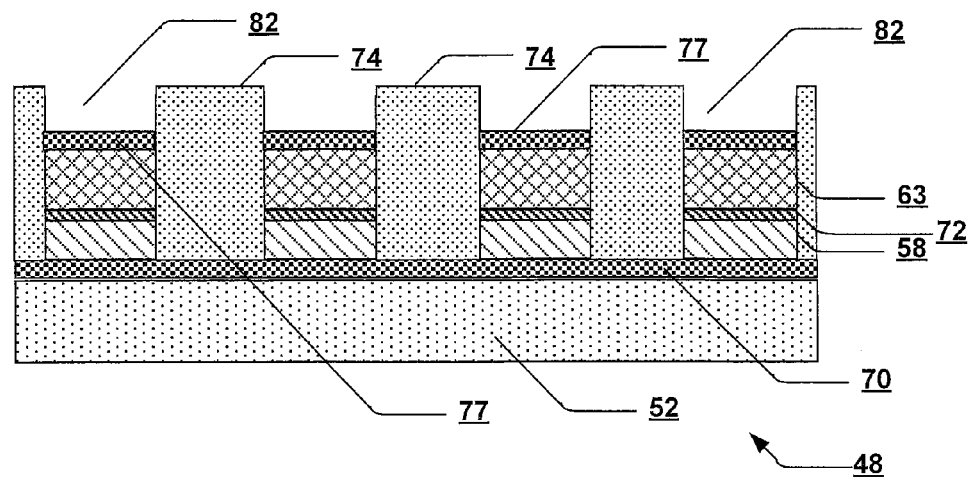
FIG. 5 is a schematic diagram showing a partial cross sectional view of the embodiment of memory shown in FIG. 1 undergoing even more fabrication

A nitride wet chemical etch or another etch technology may, for example, etch away sacrificial nitride 75, as is illustrated by FIG. 5. Optional oxide interlayer 77, which may be positioned or formed adjacent to non-metal conductive control gate 63, may at least partially protect non-metal conductive control gate 63 during removal of sacrificial nitride 75. As suggested above, sacrificial nitride layer 75 may exhibit a shape, size, or configuration that substantially reflects the desired shape, size, or configuration of metal control gate 64. As FIG. 5 illustrates, sacrificial nitride layer 75 may be etched or otherwise removed, thereby leaving behind control gate recesses 82. Etching of sacrificial nitride 75 may be performed through to optional oxide interlayer 77, if it exists, or otherwise etching may be through to non-metal conductive control gate 63. An oxide wet chemical etch may be performed to remove optional oxide interlayer 77, if it exists.

Figure 6:
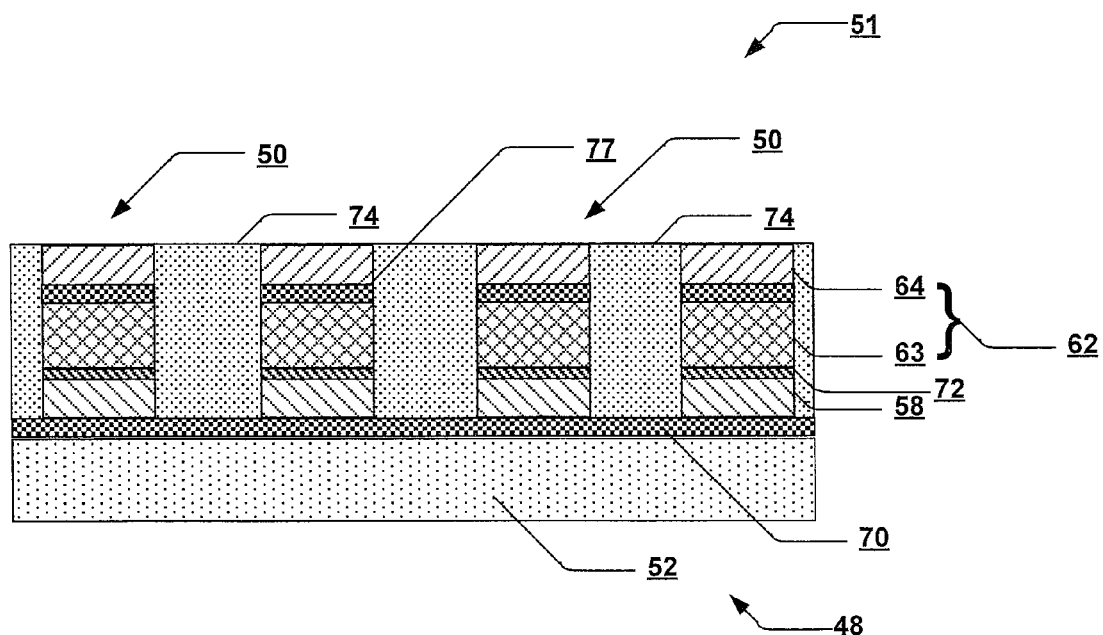
FIG. 6 is a schematic diagram showing a partial cross sectional view of the embodiment of memory shown in FIG. 1 undergoing yet still even more fabrication.

For this particular embodiment, a metal may be deposited to fill control gate recesses 82. In some embodiments, a suitable barrier layer may be provided to enhance adhesion between metal and material upon which metal is being deposited, for example. Deposited metal may flow into control gate recesses 82, which may subsequently form into one or more metal control gates 64. FIG. 6 illustrates a memory device embodiment that includes metal control gates 64. Spattered metal may be applied or other metallization techniques may be employed. These may include, for example, electrochemical deposition, or electroplating, though other metallization techniques may also be used. In certain instances, metal deposition may be performed as followed by chemical mechanical polishing to obtain a metal control gate sufficiently aligned. In this example embodiment, therefore, metal control gate layer 64 may have similar cross-sectional dimensions or shapes as non-metal conductive control gate 63, so as to provide alignment there between. As explained more fully below, substantial alignment may reduce resistive or capacitive parasitic circuit parameters that may otherwise contribute to performance delay of a device being fabricated.

Figure 7:
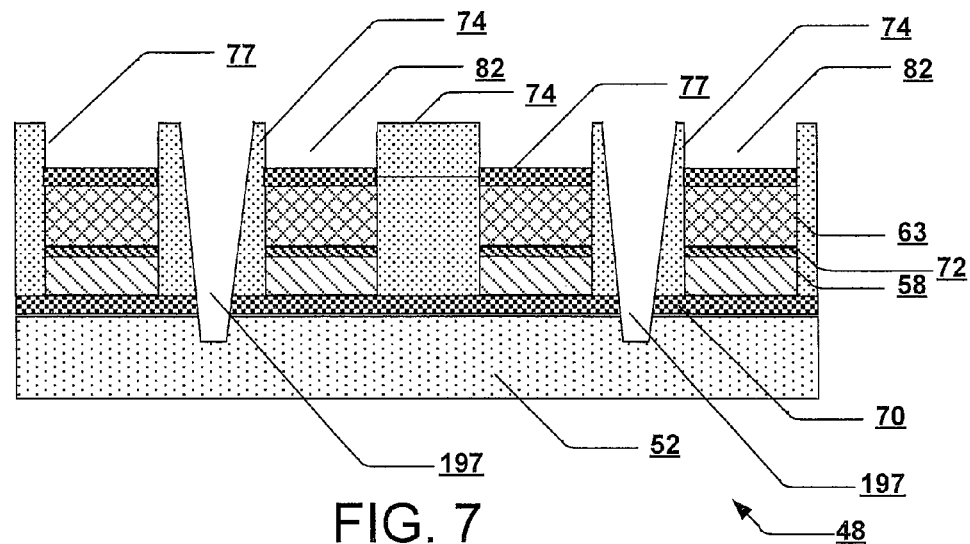
FIG. 7 is a schematic diagram showing a partial cross sectional view of a different embodiment of memory than was illustrated in FIG. 1 undergoing fabrication.

A range of potential variations of certain embodiments of the above-described FIGS. 2 to 6 processes are possible and included within the scope of claimed subject matter. Some examples are provided, but these are meant to be illustrative rather than exhaustive. FIG. 7, for example, illustrates another embodiment of a fabrication process for flash memory. For example, following fabrication as illustrated in FIG. 5, one or more contact recesses 197 may be etched, ground, planarized, or otherwise formed within inter cell material 74. In some instances, one or more recesses 197 may be used to form at least in part source contacts, interconnects, or drain contacts through deposition of metal or another conductive material within the recesses. FIG. 7 also illustrates etching of sacrificial nitride layer 75 and optional oxide interlayer 77, if it exists. Such etching of inter cell material 74 to form contact recesses 197 of FIG. 7 may be provided prior to, concurrently with, or following removal of sacrificial nitride 75.

Figure 8:
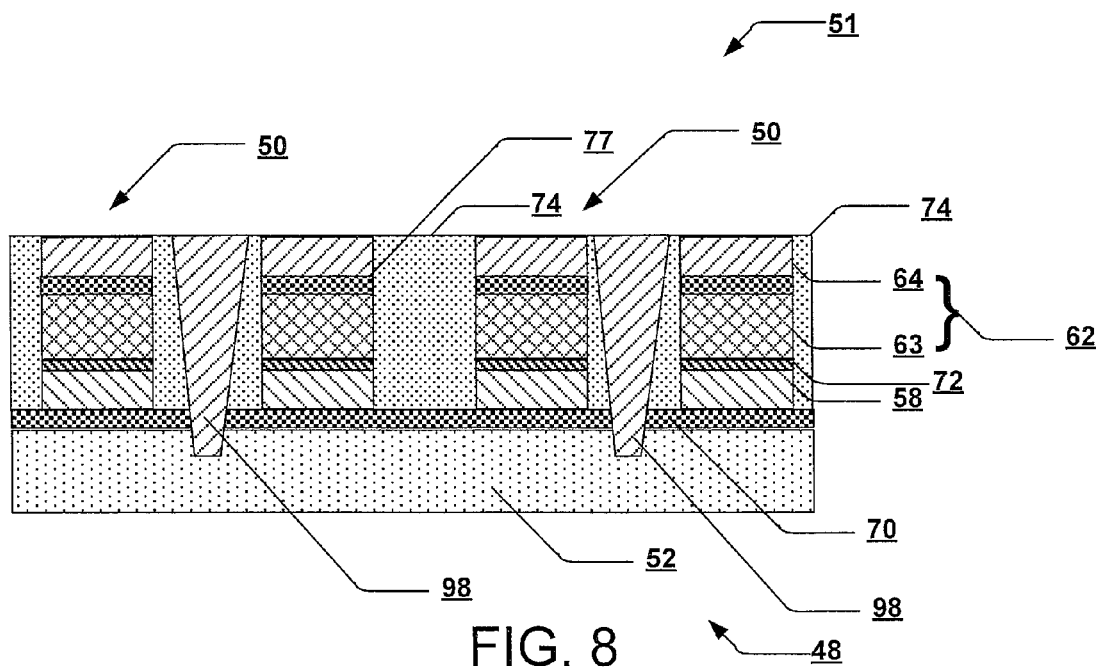
FIG. 8 is a schematic diagram showing a partial cross sectional view of the embodiment of memory shown in FIG. 7 undergoing still more fabrication.

A variety of metal deposition techniques involving deposited metals as tungsten or tungsten alloy may be performed to result in a device embodiment such as shown in FIG. 8. Again, alternatively, electro chemical deposition or electroplating techniques may be performed. Following such metal deposition of control gate recesses 82 and contact recesses 197, a single planarization may be applied to planarize control gate 64 as well as drain or source contacts 98. Such deposition and etching techniques are intended to be illustrative in nature, but not limiting in scope.

Embodiments may comprise flash memory characterized as non-volatile. In this context, the term non-volatile memory refers to memory that may substantially retain its electric charge state on a floating gate even if electricity is not applied. Thus, flash is one particular type of non-volatile memory. Information such as data being stored may be maintained using non-volatile memory. For example, a particular state may be retained in a particular non-volatile memory cell location, even with the absence of applied electrical voltage, electrical current, or other electrical power. Arranging non-volatile memory, such as flash memory cells or locations, like cells 50 of FIG. 6, for example, in arrays typically provides for a high cell or memory density within a flash memory device.

A variety of illustrative but not limiting applications for flash or other non-volatile memory devices exist. Without limitation and not intending to be exhaustive, examples may include: Basic Input/Output System (BIOS) integrated circuits, such as for a computing platform; solid state drives (SSDs); memory sticks or cards for a variety of devices, such as, digital cameras, personal digital assistants (PDAs), kiosks, point-of-sale devices, cell phones, or video games. Again, these are merely intended as a few non-limiting illustrative examples.

An embodiment of flash memory cell 50, such as shown in FIG. 1, may therefore comprise, for example, substrate 52, source 54, drain 56, tunnel layer 70, floating gate 58, poly/metal control gate assembly 62, and interpoly dielectric layer 72 situated between floating gate 58 and poly/metal control gate assembly 62. Of course, claimed subject matter is not limited in scope to this particular embodiment. Therefore, embodiments are included within the scope of claimed subject matter that may not include the foregoing elements or that may include alternative or additional elements. However, continuing with this particular embodiment of flash memory device 51, poly/metal control gate assembly 62, as described in more detail hereinafter, may comprise a non-metal conductive control gate 63 and a metal control gate 64, with optional oxide interlayer 77 sandwiched there between. Non-metal conductive control gate 63 and metal control gate 64 are both electrically conductive and may, during operation, conduct electricity through poly/metal control gate assembly 62. For certain embodiments, non-metal conductive control gate 63 may comprise a poly material, although claimed subject matter is not limited in scope in this respect.

During operation, as described with respect to FIG. 1, if suitable electric charge may be maintained in floating gate 58 to create a threshold voltage $V_T$ between floating gate 58 and substrate 52, a conduction channel, not shown, typically forms across substrate 52, such as adjacent tunnel layer 70. An electric current may thereby flow from source 54 to drain 56 through the conduction channel created therein at least partially from threshold voltage $V_T$.

Certain embodiments of floating gate 58 may be operatively interposed between control gate and substrate 52. Floating gate 58 may be electrically isolated from substrate by tunnel layer 70. Floating gate 58 may be electrically isolated from poly/metal control gate assembly 62 by interpoly dielectric layer 72. Therefore, electrons placed on floating gate 58 may be, in effect, trapped, and under normal conditions, may not discharge for a long period of time, such as a matter of years in some embodiments.

Again, although claimed subject matter is not limited in scope to a particular embodiment, here, for this embodiment, floating gate 58 may be biased, such as by poly/metal control gate assembly 62, to affect electric current passing between source 54 and drain 56. Such an effect may depend, at least in part, on a charge or a voltage signal level applied to floating gate 58, thereby acting to bias floating gate 58 relative to substrate 52. Likewise, in this embodiment, inter poly dielectric layer 72 may act as an electric insulator that may, under at least some conditions, limit flow of electricity between floating gate 58 and certain other portions of poly/metal control gate assembly 62. Interpoly dielectric layer 72 may, therefore, in this embodiment, maintain a level of electrical charge in floating gate 58 resulting in a substantially non-volatile state, as previously described.

Flash memory devices 51, such as the embodiment previously described, may include parasitic electrical properties, such as a parasitic resistance or a parasitic capacitance, for example. Typically, parasitic electrical properties are not desirable at least in part because they may adversely affect circuit operation or circuit performance. For example, parasitic resistance or parasitic capacitance may result in slower performance compared to a situation in which such parasitic electrical properties were not present. A delay may be introduced by a parasitic resistance in conjunction with a parasitic capacitance in which the amount of the delay is related at least in part to the amount of parasitic resistance and parasitic capacitance. For example, a capacitor-resistor circuit may be considered as a portion of flash memory device 51, in which the capacitor may be charged. Circuits comprising a capacitor and a resistor charge at a rate related to the product of the resistance and the capacitance. Therefore, it may be desirable to limit the amount of parasitic capacitance or the amount of parasitic resistance to reduce the potential for delay in terms of circuit operation.

An embodiment in accordance with claimed subject matter may exhibit a reduction in parasitic electrical properties that have the potential to degrade circuit performance or operation. Here, for example, poly/metal control gate assembly 62 may reduce parasitic resistance or capacitance in a circuit employing a or other non-volatile flash memory cell embodiment. Although claimed subject matter is not limited in scope in this respect, reducing cross-sectional configurations or lengths, or selecting non-metallic materials having low-dielectric constants, may reduce parasitic electrical properties.

Likewise, material incompatibility, such as high resistivity, between a metal control gate 64 and non-metal conductive control gate 63 may be reduced at least in part from substantial alignment, as described previously or by the use of control gate recesses 82, as previously described, with a desirable effect of potentially reducing parasitic electrical properties. Likewise, in certain embodiments, non-metal conductive control gate 63 may be provided between metal control gate 64 and floating gate 58 to address, in at least certain instances, material incompatibility between metal control gate 64 and floating gate 58 and produce a lower resistivity control gate for a device, for example.

A variety of techniques may be used to affect parasitic resistive or capacitive parameters. As alluded to, altering cross-sectional configurations, lengths, or alternatively by selecting suitable materials, parasitic resistance or capacitance of poly/metal control gate assembly 62 (e.g., using non-metallic materials having low-dielectric constants) may be reduced. Reducing parasitic resistance or capacitance may reduce performance delays such as those previously described.

While FIGS. 2 to 8 illustrate example embodiments of fabrication techniques as may be applied to fabricate a relatively small number of flash memory devices, cells or memory locations; nonetheless, claimed subject matter is not so limited. Therefore, it is intended that claimed subject matter include fabrication of larger numbers of flash or other non-volatile memory devices, cells or memory locations. For instance, such memory cells may be arranged in two-dimensional or three-dimensional arrays, in certain embodiments, for example. Two-dimensional arrays of memory cells 50 may be arranged across substrate 52.

Additionally, modifications may be made to adapt to a particular situation without departing from the subject matter described herein. Therefore, it may be intended that claimed subject matter not be limited to particular examples disclosed, but that such claimed subject matter may also include any and all implementations falling within the scope of appended claims, or equivalents thereof.

What is claimed is:

1. A method of fabricating a non-volatile memory device, comprising:
    depositing a non-metal conductive control gate layer over a floating gate;
    depositing a sacrificial nitride layer over the non-metal conductive control gate layer;
    selectively etching the sacrificial nitride layer leaving a selectively etched control gate recess;
and further comprising:
forming more than one flash memory cell in the non-volaitle memory device comprising:
    etching away portions of the non-metal conductive control gate layer and the sacrificial nitride layer to at least partially define boundary voids extending between separate vertical layered stacks;
    depositing at least some inter cell material within the boundary voids;
    etching one or more contact recesses in the inter cell material; and
    depositing a metal within the one or more contact recesses to form a source contact or a drain contact for the more than one flash memory cells in the non-volatile memory device.

2. The method of claim 1, wherein the depositing the non-metal conductive control gate layer over the floating gate further comprises:
    depositing an interpoly dielectric layer over the floating gate; and
    depositing the non-metal conductive control gate layer over the interpoly dielectric layer.

3. The method of claim 2, wherein a tunnel layer was previously deposited and is formed below the floating gate.

4. The method of claim 1, wherein the etching further comprises: planarizing surfaces of separate vertical stacks, following the depositing, to expose sacrificial nitride.

5. The method of claim 4, wherein the planarizing further comprises:

removing excess inter cell material from the surfaces.

6. The method of claim 5, wherein the removing comprises etching.

7. The method of claim 1, and further comprising:
planarizing surfaces of separate vertical stacks following the deposition of a metal.

8. The method of claim 7, wherein the planarizing further comprises:

removing excess metal from the surfaces.

9. The method of claim 8, wherein the removing comprises etching.

10. The method of claim 1, wherein the non-metal conductive control gate comprises a poly material.

* * * * *

UNITED STATES PATENT AND TRADEMARK OFFICE
CERTIFICATE OF CORRECTION

| | | |
|---|---|---|
| PATENT NO. | : 8,211,762 B1 | Page 1 of 1 |
| APPLICATION NO. | : 12/512907 | |
| DATED | : July 3, 2012 | |
| INVENTOR(S) | : Emilio Camerlenghi et al. | |

It is certified that error appears in the above-identified patent and that said Letters Patent is hereby corrected as shown below:

On the face page, in field (56), under "Other Publications", in column 2, line 16, delete "Contatless Flass" and insert -- Contactless Flash --, therefor.

In column 8, line 47, in Claim 1, delete "non-volaitle" and insert -- non-volatile --, therefor.

Signed and Sealed this
Thirtieth Day of October, 2012

David J. Kappos
*Director of the United States Patent and Trademark Office*